United States Patent
Karp et al.

(10) Patent No.: US 10,811,493 B2
(45) Date of Patent: Oct. 20, 2020

(54) SINGLE EVENT LATCH-UP (SEL) MITIGATION TECHNIQUES

(71) Applicant: Xilinx, Inc., San Jose, CA (US)

(72) Inventors: James Karp, Saratoga, CA (US); Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/109,273

(22) Filed: Aug. 22, 2018

(65) Prior Publication Data

US 2020/0066837 A1     Feb. 27, 2020

(51) Int. Cl.
| | |
|---|---|
| *H01L 29/06* | (2006.01) |
| *H01L 27/092* | (2006.01) |
| *H01L 27/06* | (2006.01) |

(52) U.S. Cl.
CPC ......... *H01L 29/0619* (2013.01); *H01L 27/06* (2013.01); *H01L 27/0921* (2013.01)

(58) Field of Classification Search
None
See application file for complete search history.

(56) References Cited

U.S. PATENT DOCUMENTS

| | | |
|---|---|---|
| 5,828,231 A | 10/1998 | Bazargan |
| 6,735,110 B1 | 5/2004 | Lesea |
| 6,822,894 B1 | 11/2004 | Costello et al. |
| 6,903,571 B1 | 6/2005 | Trimberger |
| 6,914,804 B2 | 7/2005 | Lesea |
| 7,064,574 B1 | 6/2006 | Voogel et al. |
| 7,111,215 B1 | 9/2006 | Keller et al. |
| 7,139,190 B1 | 11/2006 | de Jong |
| 7,236,000 B1 | 6/2007 | Steiner |
| 7,386,828 B1 | 6/2008 | Safarpour et al. |
| 7,764,081 B1 | 7/2010 | Tuan et al. |
| 7,990,173 B1 | 8/2011 | Tseng et al. |
| 8,065,644 B1 | 11/2011 | Jacobson et al. |
| 8,261,229 B2 | 9/2012 | Hart |
| 8,635,581 B1 | 1/2014 | Tseng et al. |
| 8,692,381 B1 | 4/2014 | Hart |
| 9,183,338 B1 | 11/2015 | Jain et al. |
| 9,483,599 B1 | 11/2016 | Jain et al. |

(Continued)

OTHER PUBLICATIONS

Troutman, Robert R., "Latchup in CMOS Technology: The Problem and Its Cure," 1999, p. 165, 4th ed., Kluwer Academic Publishers, Norwell, MA, USA.

(Continued)

*Primary Examiner* — Jack S Chen
(74) *Attorney, Agent, or Firm* — Patterson + Sheridan, LLP (57) ABSTRACT

Examples described herein provide for single event latch-up (SEL) mitigation techniques. In an example, a semiconductor structure includes a semiconductor substrate, a p-type transistor having p+ source/drain regions disposed in a n-doped region in the semiconductor substrate, an n-type transistor having n+ source/drain regions disposed in a p-doped region in the semiconductor substrate, a n+ guard ring disposed in the n-doped region and laterally around the p+ source/drain regions of the p-type transistor, and a p+ guard ring disposed laterally around the n-doped region. The p+ guard ring is disposed between the p-type transistor and the n-type transistor.

20 Claims, 8 Drawing Sheets

(56) References Cited

U.S. PATENT DOCUMENTS 9,825,632 B1 11/2017 Maillard et al.
2013/0299890 A1* 11/2013 Oh .................... H01L 27/108
257/306

OTHER PUBLICATIONS

Karp, James et al., "Single Event Latch-up: Increased Sensitivity from Planar to FinFET," IEEE Transactions on Nuclear Science, Jan. 2018, pp. 217-222, vol. 65, No. 1, IEEE, Piscataway, New Jersey, USA.

* cited by examiner

SINGLE EVENT LATCH-UP (SEL) MITIGATION TECHNIQUES

TECHNICAL FIELD

Examples of the present disclosure generally relate to semiconductor structures of integrated circuits and, in particular, to mitigation of single event latch-up (SEL) in semiconductor structures of integrated circuits.

BACKGROUND

Single event latch-up (SEL) is generally an abnormal high-current state in a device caused by the passage of an energetic particle through sensitive regions of the device structure. SEL can result in the loss of device functionality. In complementary device structures in integrated circuits (such as in complementary metal-oxide-semiconductor (CMOS) structures), SEL can result in a parasitic silicon controlled rectifier (SCR) structure turning on to conduct a current. When the parasitic SCR structure is turned on, a voltage drop across the parasitic SCR structure can result in the parasitic SCR structure continuing to conduct the current. The continuous conduction of the current can damage the integrated circuit, such as by generating heat that can cause melting of components, migration of metal, or other problems.

SUMMARY

Examples described herein provide for single event latch-up (SEL) mitigation techniques. In examples describe herein, a p-type device (e.g., a p-type metal-oxide-semiconductor (PMOS) device) centric approach is described. In some examples, unnecessary guard rings may be obviated, and a layout size of the devices and guard rings on a substrate may be reduced. Additionally, placing devices can be simpler and easier to implement.

An example of the present disclosure is a semiconductor structure. The semiconductor structure includes a semiconductor substrate, a first p-type transistor having first p+ source/drain regions disposed in a first n-doped region in the semiconductor substrate, an n-type transistor having n+ source/drain regions disposed in a p-doped region in the semiconductor substrate, a first n+ guard ring disposed in the first n-doped region and laterally around the first p+ source/drain regions of the first p-type transistor, and a p+ guard ring disposed laterally around the first n-doped region. The p+ guard ring is disposed between the first p-type transistor and the n-type transistor.

Another example of the present disclosure is a semiconductor structure. The semiconductor structure includes a semiconductor substrate, a first transistor having a first source/drain region doped with a dopant of a first conductivity type in the semiconductor substrate, a second transistor having a second source/drain region doped with a dopant of a second conductivity type in the semiconductor substrate, a first guard ring doped with a dopant of the second conductivity type in the semiconductor substrate, and a second guard ring doped with a dopant of the first conductivity type in the semiconductor substrate. The first guard ring is disposed laterally around the first source/drain region and between the first source/drain region and the second source/drain region, and the second guard ring is disposed laterally around the first source/drain region and between the first source/drain region and the second source/drain region.

A further example of the present disclosure is a semiconductor structure. The semiconductor structure includes a p-doped substrate, a first n-well disposed in the p-doped substrate, a first p+ source/drain region of a first p-type transistor disposed in the first n-well, a first n+ guard ring disposed in the first n-well and laterally around the first p+ source/drain region, a p+ guard ring disposed in the p-doped substrate and laterally around the first n-well, and an n+ source/drain region of an n-type transistor disposed in the p-doped substrate.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein provide for single event latch-up (SEL) mitigation techniques. In examples describe herein, a p-type device (e.g., a p-type metal-oxide-semiconductor (PMOS) device) centric approach is described. A p+ guard ring is formed around one or more p-type devices or around a cluster of p-type devices, where the cluster includes multiple n-wells, each of which having one or more of the p-type devices. Further, interior to the p+ guard ring, an n+ guard ring is formed around the one or more p-type devices (e.g., in each n-well of the one or more p-type devices). In further examples, an additional n+ guard ring, disposed in a separate n-well, is disposed around the n+ guard ring(s) and between the n+ guard ring(s) and the p+ guard ring. By employing such a guard ring scheme, unnecessary guard rings may be obviated, and a layout size of the devices and guard rings on a substrate may be reduced. Additionally, placing devices with such a guard ring scheme can be simpler and easier to implement, including implementation and verification.

Generally, latch-up in complementary FET structures (e.g. complementary metal-oxide-semiconductor (CMOS)) can be caused by the triggering of a parasitic silicon controlled rectifier (SCR) structure. The parasitic SCR structure may be formed by, e.g., a p+ source region of a p-type transistor, an n-well in which the p+ source region is disposed, a p-doped region proximate the n-well (e.g., a p-doped substrate in which the n-well is disposed), and an n+ source region of an n-type transistor disposed in the p-doped region. Hence, these regions can form a PNPN structure (e.g., including bipolar junctions). SEL can be caused by transient current originating from charges generated along the track of an incident charged particle. The transition from planar technology to fin field effect transistor (finFET) technology has generally changed the parameters of the parasitic SCR structure, and has generally eased triggering of SEL. SEL generally creates a current through a parasitic SCR structure that is electrically coupled between a power node and a ground node, and the current, once triggered, may continue to flow as long as a hold voltage is across the parasitic SCR structure.

Guard rings, as described herein, are used to decouple parasitic bipolar junctions of the parasitic SCR structure that can be formed by the complementary transistors. By implementing guard rings, a gain $\beta_{PNP} \times \beta_{NPN}$ can be reduced that reduces the likelihood of latch up of the parasitic SCR structure (e.g., by reducing a voltage drop across the parasitic SCR so that the parasitic SCR is less likely to achieve the hold voltage). Examples described herein can achieve this reduced gain in a smaller layout footprint and in a simpler design.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1A:
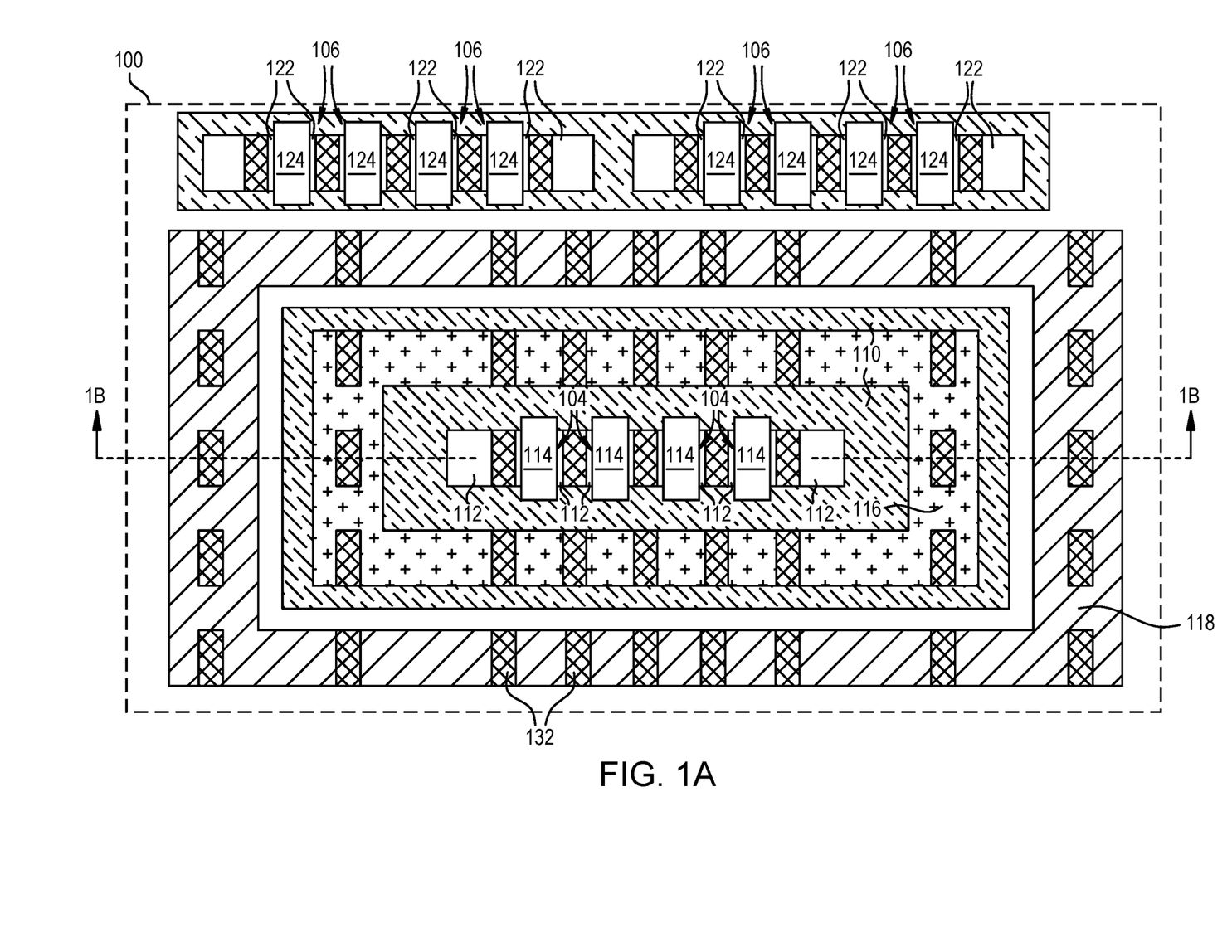
FIGS. 1A and 1B are a layout and cross-sectional view, respectively, of a cell on a semiconductor substrate implementing a single event latch-up (SEL) mitigation technique according to an example.
Figure 1B:
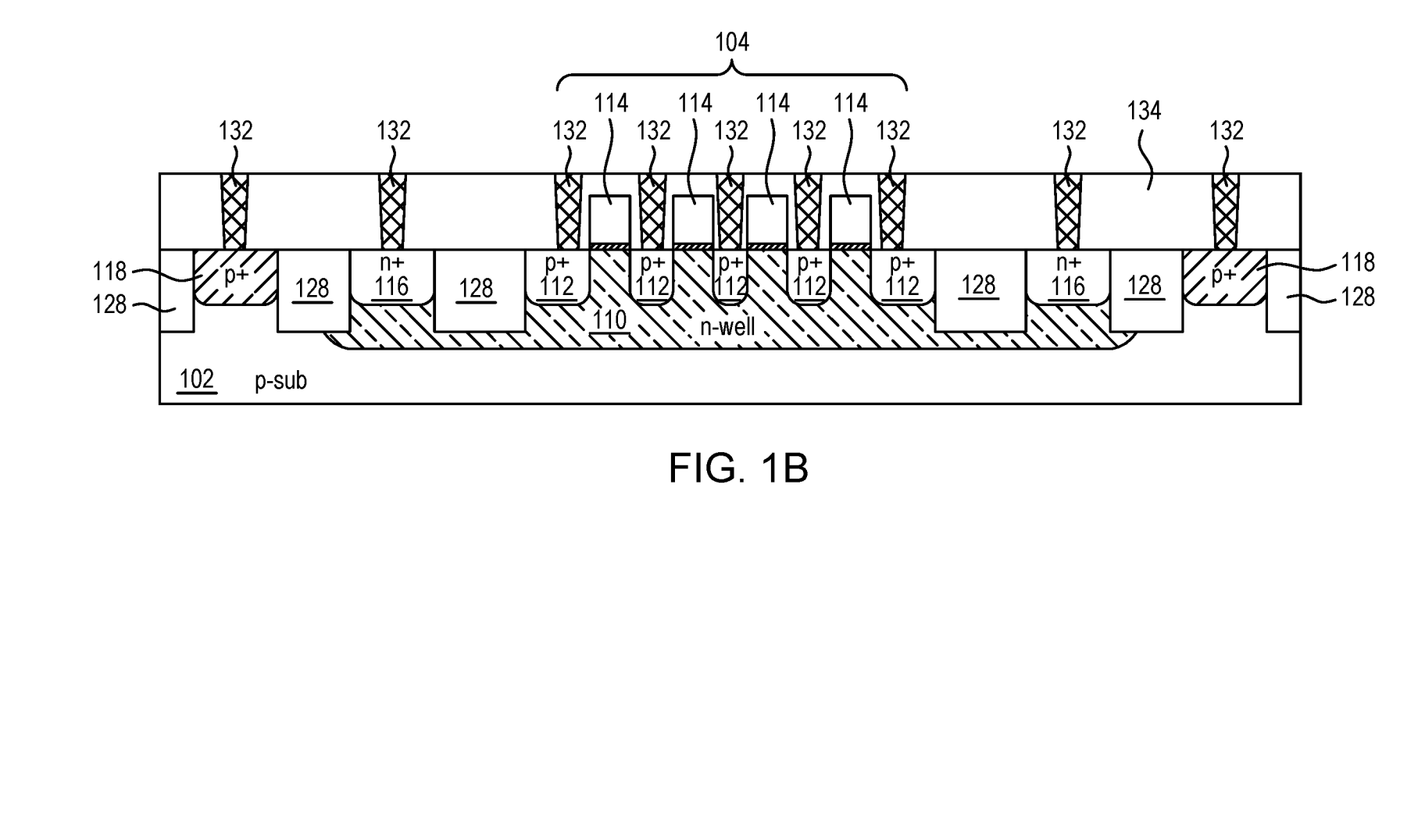

FIGS. 1A and 1B illustrate a SEL mitigation technique according to an example. FIG. 1A illustrates a layout of a cell 100 on a semiconductor substrate 102, and FIG. 1B illustrates a cross-sectional view of the cell 100 on the semiconductor substrate 102 along the cross-section 1B-1B shown in FIG. 1A. The cell 100 can be for a complementary (e.g., CMOS) input/output device, for example. The cell 100 includes p-type field effect transistors (pFETs) 104 and n-type FETs (nFETs) 106, as illustrated. In other examples, the cell 100 can include a single pFET and a single nFET, or can include any number and combination of pFETs and nFETs. The cell 100 can be repeated any number of times on the semiconductor substrate 102.

The semiconductor substrate 102 includes a p-doped semiconductor material (e.g., a p-doped region). For example, the semiconductor substrate 102 can be silicon doped with a p-type dopant. Other semiconductor material can be implemented. The p-type dopant can be introduced into the semiconductor substrate 102 during formation of the ingot that is subsequently formed into the semiconductor substrate 102, by epitaxially growing a material on the semiconductor substrate 102 that is doped in situ with the p-type dopant, and/or by implantation of the p-type dopant into the semiconductor substrate 102 during processing. The concentration of the p-type dopant in the semiconductor substrate 102 can be in a range from about $1 \times 10^{13}$ cm$^{-3}$ to about $5 \times 10^{13}$ cm$^{-3}$.

An n-well 110 is formed in the semiconductor substrate 102. The n-well 110 is formed where the pFETs 104 are to be formed. The n-well 110 can be formed by implantation of an n-type dopant into the semiconductor substrate 102 and/or by etching the semiconductor substrate 102 and epitaxially growing a material that is doped in situ with n-type dopant. In some examples, the concentration of the n-type dopant in the n-well 110 is greater, such as by an order of magnitude or more, than the concentration of the p-type dopant in the semiconductor substrate 102. The concentration of the n-type dopant in the n-well 110 can be in a range from about $1 \times 10^{18}$ cm$^{-3}$ to about $5 \times 10^{18}$ cm$^{-3}$.

Each of the pFETs 104 includes source/drain regions 112 on opposing sides of a respective one of gates 114. Each of the source/drain regions 112 includes a p+ doped region disposed in the n-well 110 in the semiconductor substrate 102. The p+ doped regions can be formed by implantation of a p-type dopant and/or by etching the semiconductor substrate 102 and epitaxially growing a material that is doped in situ with p-type dopant. The source/drain regions 112 can be self-aligned with the gates 114. Each of the pFETs 104 further includes a channel region underlying the respective one of the gates 114. The channel region is a portion of the n-well 110 in the semiconductor substrate 102. The concentration of the p-type dopant in the p+ doped regions of the source/drain regions 112 is greater, such as by an order of magnitude or more, than the concentration of the n-type dopant in the n-well 110. The concentration of the p-type dopant in the p+ doped regions of the source/drain regions 112 can be in a range from about $1 \times 10^{19}$ cm$^{-3}$ to about $1 \times 10^{21}$ cm$^{-3}$.

An n+ guard ring 116 is formed in the n-well 110 in the semiconductor substrate 102 and laterally around the pFETs 104. The n+ guard ring 116 can be formed by implantation of an n-type dopant or other technique. The concentration of the n-type dopant in the n+ guard ring 116 is greater, such as by an order of magnitude or more, than the concentration of the n-type dopant in the n-well 110. The concentration of the n-type dopant in the n+ guard ring 116 can be in a range from about $1 \times 10^{19}$ cm$^{-3}$ to about $1 \times 10^{21}$ cm$^{-3}$.

A p+ guard ring 118 is formed in the semiconductor substrate 102 and laterally around the n-well 110 and n+ guard ring 116. The p+ guard ring 118 can be formed by implantation of a p-type dopant. The concentration of the p-type dopant in the p+ guard ring 118 is greater, such as by an order of magnitude or more, than the concentration of the p-type dopant in the p-doped semiconductor substrate 102. The concentration of the p-type dopant in the p+ guard ring 118 can be in a range from about $1 \times 10^{19}$ cm$^{-3}$ to about $1 \times 10^{21}$ cm$^{-3}$.

The nFETs 106 are formed laterally outside of the p+ guard ring 118 and the n+ guard ring 116. Each of the p+ guard ring 118 and the n+ guard ring 116 is disposed between the pFETs 104 and the nFETs 106. Each of the nFETs 106 includes source/drain regions 122 on opposing sides of respective one of gates 124. Each of the source/drain regions 122 includes an n+ doped region disposed in the p-doped semiconductor substrate 102. The n+ doped regions can be formed by implantation of an n-type dopant and/or by etching the semiconductor substrate 102 and epitaxially growing a material that is doped in situ with n-type dopant. The source/drain regions 122 can be self-aligned with the gates 124. Each of the nFETs 106 further includes a channel region underlying the respective one of the gates 124. The channel region is a portion of the p-doped semiconductor substrate 102. The concentration of the n-type dopant in the n+ doped regions of the source/drain regions 122 is greater, such as by an order of magnitude or more, than the concentration of the p-type dopant in the p-doped semiconductor substrate 102. The concentration of the n-type dopant in the n+ doped regions of the source/drain regions 122 can be in a range from about $1\times10^{19}$ cm$^{-3}$ to about $1\times10^{21}$ cm$^{-3}$.

Isolation regions 128 (e.g., shallow trench isolations (STIs)) are formed in the semiconductor substrate 102 and between various doped regions as shown in the cross-section of FIG. 1B (and not explicitly identified in the layout of FIG. 1A). Various contacts 132 may be formed to the source/drain regions 112 of the pFETs 104, n+ guard ring 116, p+ guard ring 118, and source/drain regions 122 of the nFETs 106, such as through a dielectric layer 134 (e.g., interlayer dielectric) over the semiconductor substrate 102. The contacts 132 may be connected to various interconnects to form various circuits. For example, contacts 132 to the source/drain regions 112 of the pFETs 104 and to the source/drain regions 122 of the nFETs 106 may be connected to form an input/output circuit that includes the pFETs 104 and nFETs 106. The contacts 132 to the n+ guard ring 116 may be connected together to a same node, and the contacts 132 to the p+ guard ring 118 may be connected together to a same node.

As illustrated by the layout of FIG. 1A, the two guard rings (the n+ guard ring 116 and the p+ guard ring 118) are laterally around the pFETs 104, while no guard ring is laterally around the nFETs 106 that is not also around the pFETs 104 (such as around a larger area of the semiconductor substrate 102 that is not depicted).

In the following examples, description of various formation techniques and dopant concentrations of doped regions is omitted for brevity. A person having ordinary skill in the art will readily understand a correspondence between regions of the foregoing example and regions of following examples, such that such a person would understand how the preceding description applies to the regions of the following examples. For example, description of the semiconductor substrate 102 applies to following semiconductor substrates; description of n+ and p+ regions of source/drain regions 112 and 122 applies to following n+ and p+ regions of source/drain regions; description of n-well 110 applies to following n-wells and n-well rings; and description of n+ and p+ guard rings 116 and 118 applies to following n+ and p+ guard rings.

Figure 2A:
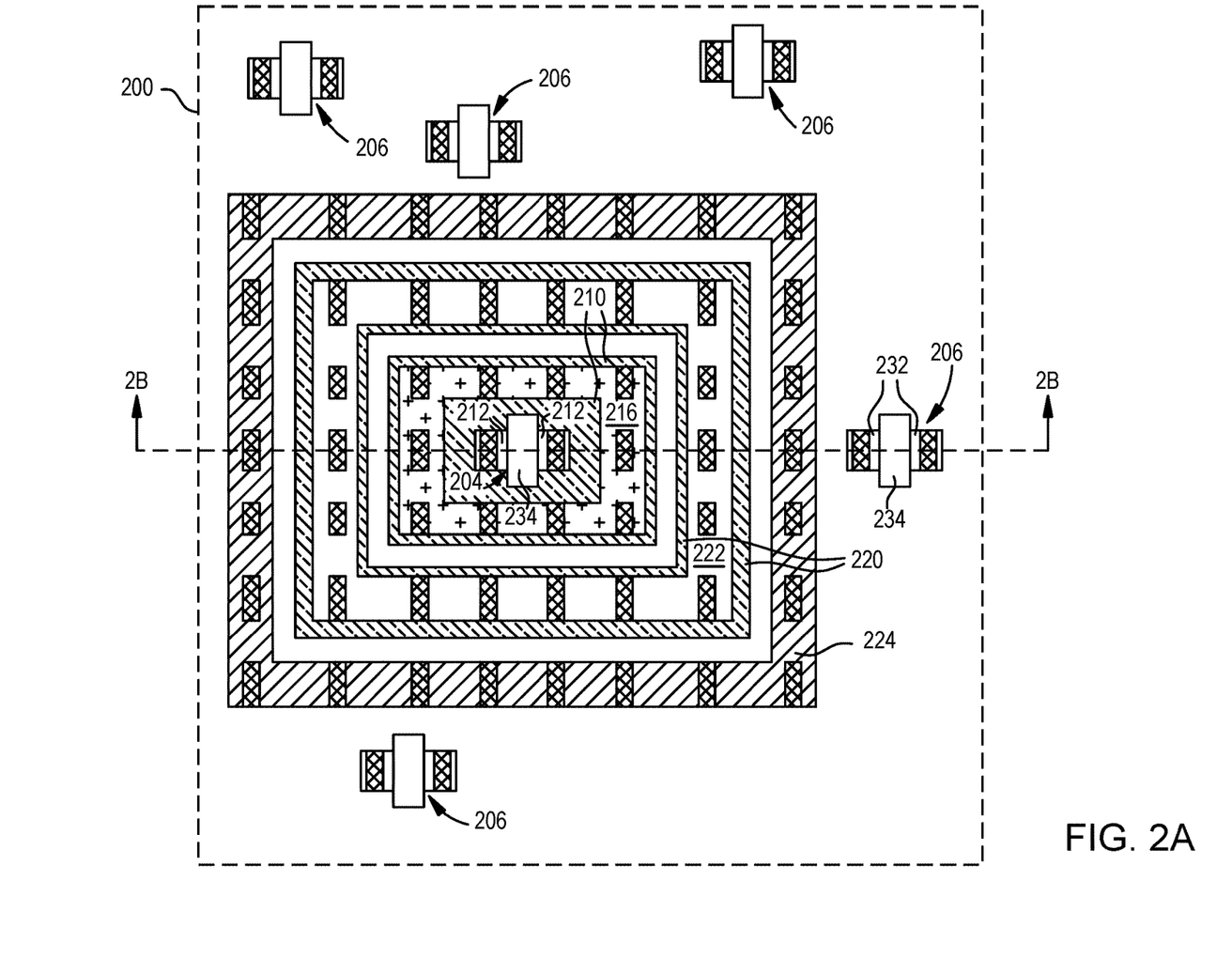
FIGS. 2A and 2B are a layout and cross-sectional view, respectively, of a stochastic arrangement on a semiconductor substrate implementing another SEL mitigation technique according to an example.
Figure 2B:
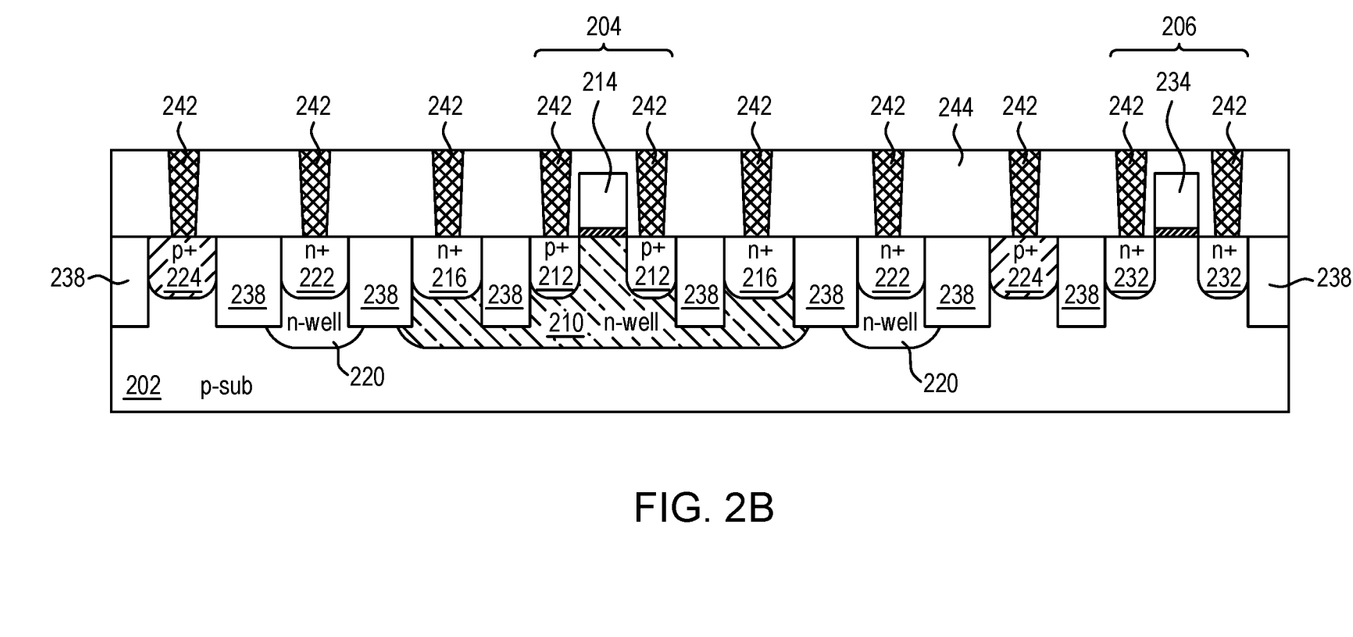

FIGS. 2A and 2B illustrate another SEL mitigation technique according to an example. FIG. 2A illustrates a layout of a stochastic arrangement 200 on a semiconductor substrate 202, and FIG. 2B illustrates a cross-sectional view of the stochastic arrangement 200 on the semiconductor substrate 202 along the cross-section 2B-2B shown in FIG. 2A. The stochastic arrangement 200 can be for a complementary (e.g., CMOS) circuit, for example. The stochastic arrangement 200 includes one pFET 204 and multiple nFETs 206, as illustrated. In other examples, the cell 100 can include a single pFET and a single nFET, or can include any number and combination of pFETs and nFETs.

The semiconductor substrate 202 includes a p-doped semiconductor material (e.g., a p-doped region). An n-well 210 is formed in the semiconductor substrate 202. The pFET 204 includes source/drain regions 212 on opposing sides of a gate 214. Each of the source/drain regions 212 includes a p+ doped region disposed in the n-well 210 in the semiconductor substrate 202. The pFET 204 further includes a channel region underlying the gate 214. The channel region is a portion of the n-well 210 in the semiconductor substrate 202. A first n+ guard ring 216 is formed in the n-well 210 in the semiconductor substrate 202 and laterally around the pFET 204.

An n-well ring 220 is formed in the semiconductor substrate 202 laterally around, and separate from, the n-well 210. A second n+ guard ring 222 is formed in the n-well ring 220 in the semiconductor substrate 202, laterally around and separate from the first n+ guard ring 216, and laterally around the pFET 204. The second n+ guard ring 222 can be a minority carrier guard ring, and may be omitted (along with the n-well ring 220) in some examples. A p+ guard ring 224 is formed in the semiconductor substrate 202 and laterally around and separate from the n-well ring 220 and second n+ guard ring 222.

The nFETs 206 are formed laterally outside of the p+ guard ring 224, the second n+ guard ring 222, and the first n+ guard ring 216. Each of the p+ guard ring 224, the second n+ guard ring 222, and the first n+ guard ring 216 is disposed between the pFET 204 and the nFETs 206. Each of the nFETs 206 includes source/drain regions 232 on opposing sides of a respective gate 234. Each of the source/drain regions 232 includes an n+ doped region disposed in the p-doped semiconductor substrate 202. Each of the nFETs 206 further includes a channel region underlying the respective gate 234. The channel region is a portion of the p-doped semiconductor substrate 202.

Isolation regions 238 (e.g., STIs) are formed in the semiconductor substrate 202 and between various doped regions as shown in the cross-section of FIG. 2B (and not explicitly identified in the layout of FIG. 2A). Various contacts 242 may be formed to the source/drain regions 212 of the pFET 204, first n+ guard ring 216, second n+ guard ring 222, p+ guard ring 224, and source/drain regions 232 of the nFETs 206, such as through a dielectric layer 244 (e.g., interlayer dielectric) over the semiconductor substrate 202. The contacts 242 may be connected to various interconnects to form various circuits. For example, contacts 242 to the source/drain regions 212 of the pFET 204 and to the source/drain regions 232 of the nFETs 206 may be connected to form any circuit that includes the pFET 204 and any of the nFETs 206. The contacts 242 to the first n+ guard ring 216 may be connected together to a same node; the contacts 242 to the second n+ guard ring 222 may be connected together to a same node; and the contacts 242 to the p+ guard ring 224 may be connected together to a same node.

As illustrated by the layout of FIG. 2A, the three guard rings (the first n+ guard ring 216, the second n+ guard ring 222, and the p+ guard ring 224) are laterally around the pFET 204, while no guard ring is laterally around any of the nFETs 206 that is not also around any of the pFETs 204 (such as around a larger area of the semiconductor substrate 202 that is not depicted).

Figure 3A:
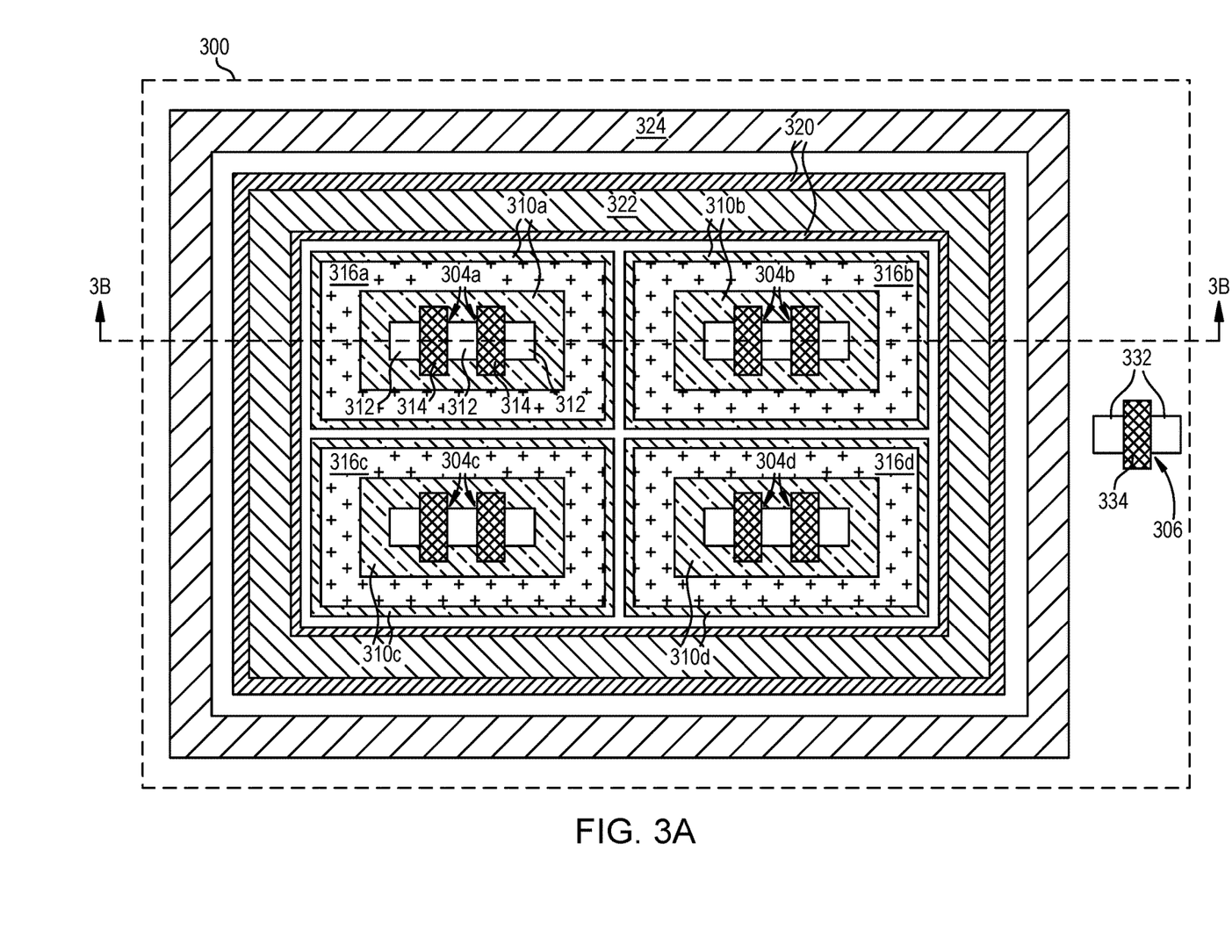
FIGS. 3A and 3B are a layout and cross-sectional view, respectively, of a cluster arrangement on a semiconductor substrate implementing a further SEL mitigation technique according to an example.
Figure 3B:
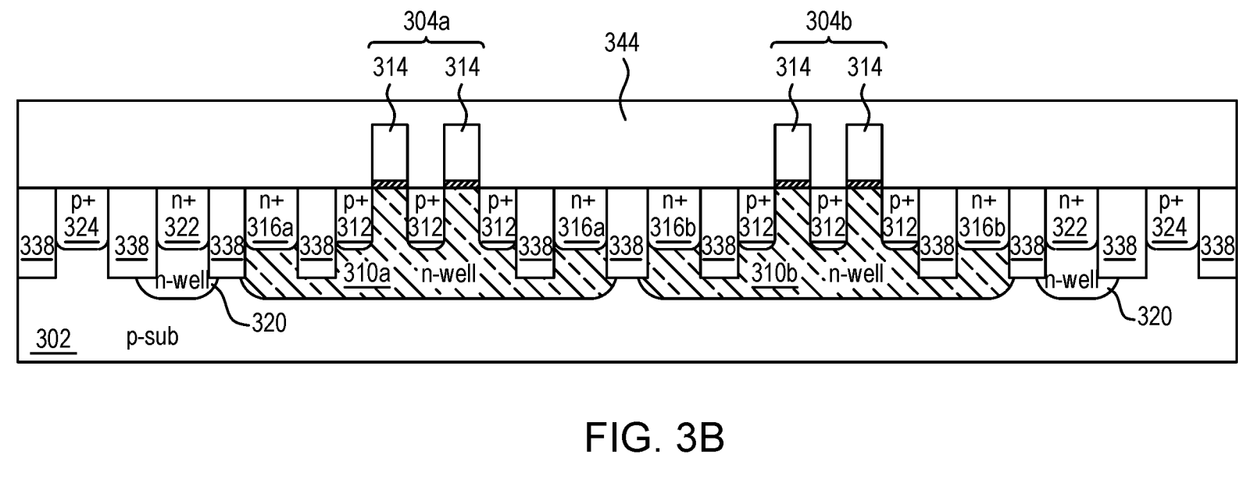

FIGS. 3A and 3B illustrate a further SEL mitigation technique according to an example. FIG. 3A illustrates a layout of a cluster arrangement 300 on a semiconductor substrate 302 including a cluster of multiple n-wells having different pFETs disposed therein, and FIG. 3B illustrates a cross-sectional view of the cluster arrangement 300 on the semiconductor substrate 302 along the cross-section 3B-3B shown in FIG. 3A. Aspects of the cluster arrangement 300

(e.g., relating to the cluster of multiple n-wells) can be applied to a cell like in FIGS. 1A and 1B and to a stochastic arrangement like in FIGS. 2A and 2B. Some features, such as contacts, are omitted from FIGS. 3A and 3B to not obscure other features, but a person having ordinary will readily understand the presence and applicability of various features that have been illustrated in and described with respect to FIGS. 1A, 1B, 2A, and 2B.

The cluster arrangement 300 includes pFETs 304a, 304b, 304c, and 304d and a single nFET 306 formed on a semiconductor substrate 302, as illustrated. In other examples, the cluster arrangement 300 can include any number and combination of pFETs and nFETs. The semiconductor substrate 302 includes a p-doped semiconductor material (e.g., a p-doped region). Separate n-wells 310a, 310b, 310c, and 310d are formed in the semiconductor substrate 302. Each of the pFETs 304a, 304b, 304c, and 304d includes source/drain regions 312 on opposing sides of a respective one of gates 314. Each of the source/drain regions 312 includes a p+ doped region disposed in the respective one of the n-wells 310a, 310b, 310c, and 310d in the semiconductor substrate 302. Each of the pFETs 304a, 304b, 304c, and 304d further includes a channel region underlying the respective one of the gates 314. The channel region is a portion of the respective one of the n-wells 310a, 310b, 310c, and 310d in the semiconductor substrate 302. First n+ guard rings 316a, 316b, 316c, and 316d are formed in the n-wells 310a, 310b, 310c, and 310d, respectively, in the semiconductor substrate 302 and laterally around the pFETs 304a, 304b, 304c, and 304d, respectively.

More specifically, the pFETs 304a are formed in the n-well 310a; the pFETs 304b are formed in the n-well 310b; the pFETs 304c are formed in the n-well 310c; and the pFETs 304d are formed in the n-well 310d. The first n+ guard ring 316a is disposed in the n-well 310a and around the pFETs 304a; the first n+ guard ring 316b is disposed in the n-well 310b and around the pFETs 304b; the first n+ guard ring 316c is disposed in the n-well 310c and around the pFETs 304c; and the first n+ guard ring 316d is disposed in the n-well 310d and around the pFETs 304d. Although four n-wells with two pFETs disposed therein and with a respective first n+ guard ring around the two pFETs are illustrated, any number of n-wells may be implemented with any number of pFETs in each n-well with a respective first n+ guard ring around the pFETs. The separate n-wells 310a, 310b, 310c, and 310d permit a different supply voltage to be implemented at each of the n-wells 310a, 310b, 310c, and 310d (e.g., to be connected to source/drain regions 312 in the n-wells 310a, 310b, 310c, and 310d).

An n-well ring 320 is formed in the semiconductor substrate 302 laterally around, and separate from, the n-wells 310a, 310b, 310c, and 310d. A second n+ guard ring 322 is formed in the n-well ring 320 in the semiconductor substrate 302, laterally around and separate from the first n+ guard rings 316a, 316b, 316c, and 316d, and laterally around the pFETs 304a, 304b, 304c, and 304d. The second n+ guard ring 322 can be a minority carrier guard ring, and may be omitted (along with the n-well ring 320) in some examples. A p+ guard ring 324 is formed in the semiconductor substrate 302 and laterally around and separate from the n-well ring 320 and second n+ guard ring 322.

The nFET 306 is formed laterally outside of the p+ guard ring 324, the second n+ guard ring 322, and the first n+ guard rings 316a, 316b, 316c, and 316d. Each of the p+ guard ring 324, the second n+ guard ring 322, and at least one of the first n+ guard rings 316a, 316b, 316c, and 316d is disposed between the pFETs 304a, 304b, 304c, and 304d and the nFET 306. The nFET 306 includes source/drain regions 332 on opposing sides of a gate 334. Each of the source/drain regions 332 includes an n+ doped region disposed in the p-doped semiconductor substrate 302. The nFET 306 further includes a channel region underlying the gate 334. The channel region is a portion of the p-doped semiconductor substrate 302.

Isolation regions 338 (e.g., STIs) are formed in the semiconductor substrate 302 and between various doped regions as shown in the cross-section of FIG. 3B (and not explicitly identified in the layout of FIG. 3A). Various contacts (not illustrated) may be formed to the source/drain regions 312 of the pFETs 304a, 304b, 304c, 304d, first n+ guard rings 316a, 316b, 316c, and 316d, second n+ guard ring 322, p+ guard ring 324, and source/drain regions 332 of the nFET 306, such as through a dielectric layer 344 (e.g., interlayer dielectric) over the semiconductor substrate 302. The contacts may be connected to various interconnects to form various circuits.

As illustrated by the layout of FIG. 3A, three guard rings (at least one of the first n+ guard rings 316a, 316b, 316c, and 316d; the second n+ guard ring 322; and the p+ guard ring 324) are laterally around the respective pFETs 304a, 304b, 304c, and 304d, while no guard ring is laterally around the nFET 306 that is not also around any of the pFETs 304a, 304b, 304c, and 304d (such as around a larger area of the semiconductor substrate 302 that is not depicted).

As shown in the foregoing examples, guard rings are implemented around one or more pFETs, which can obviate the need to implement any guard ring around an nFET that is not also around the pFET(s) (e.g., around a larger area of the chip). This can further reduce unnecessary guard rings that may otherwise be implemented, and can reduce a layout area of a design. Additionally, simpler and easier designs may be implemented since guard rings around nFETs may be obviated.

Figure 4:
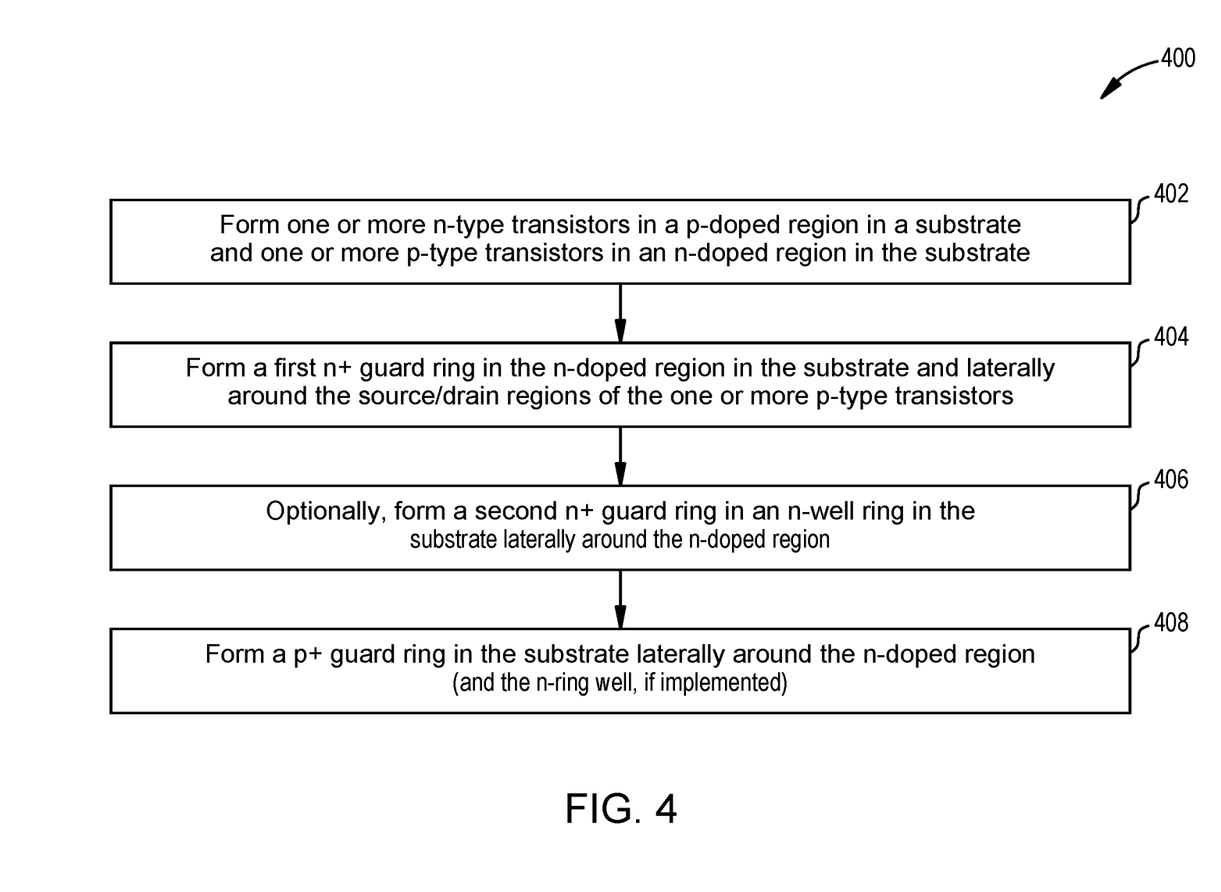
FIG. 4 is an example method for implementing an SEL mitigation technique according to some examples.

FIG. 4 is an example method 400 for implementing an SEL mitigation technique according to some examples. In operation 402, one or more n-type transistors are formed in a p-doped region in a substrate, and one or more p-type transistors are formed in an n-doped region in the substrate. More specifically, source/drain regions of the n-type transistor(s) are formed in the p-doped region, and source/drain regions of the p-type transistor(s) are formed in the n-doped region. Further, in some examples, multiple n-doped regions may be formed, and one or more p-type transistors may be formed in each of the multiple n-doped regions. As examples, source/drain regions 122, 232, 332 of the nFETs 106, 206, 306 are formed in the p-doped region (e.g., p-doped semiconductor substrate 102, 202, 302), and source/drain regions 112, 212, 312 of the pFETs 104, 204, 304a-d are formed in the n-well 110, 210, 310a-d. The layout of the various transistors may be according to a repeating cell on the substrate or a stochastic layout.

In operation 404, a first n+ guard ring is formed in the n-doped region in the substrate and laterally around the source/drain regions of the one or more p-type transistors. In some examples where multiple n-doped regions may be formed, a first n+ guard ring may be formed in each of the multiple n-doped regions and laterally around corresponding source/drain regions in the respective n-doped region. As examples, an n+ guard ring 116, 216, 316a-d is formed in the n-well 110, 210, 310a-d and laterally around the source/drain regions 112, 212, 312 of the pFETs 104, 204, 304a-d.

In operation 406, optionally, a second n+ guard ring is formed in an n-well ring in the substrate laterally around the n-doped region. In some examples where multiple n-doped regions may be formed, a second n+ guard ring may be formed in an n-well ring that is laterally around the multiple n-doped regions. As examples, a second n+ guard ring 222, 322 is formed in an n-well ring 220, 320 laterally around the n-well 110, 210, 310a-d.

In operation 408, a p+ guard ring is formed in the substrate laterally around the n-doped region and, if optionally implemented, the n-well ring. As examples, a p+ guard ring 118, 224, 324 is formed laterally around the n-well 110, 210, 310a-d and, if implemented, the n-well ring 220, 320.

A person having ordinary skill in the art will readily understand that the processing to form the various components formed by the method 400 of FIG. 4 can be implemented by doping a substrate, such as by implantation, that may be performed according to any appropriate sequence. For example, various components formed by the method 400 that are illustrated as being formed in different operations may be formed simultaneously or in a different sequence from what is illustrated. Various other features of the SEL mitigation techniques implemented by the method 400 can be as described with respect to and illustrated in any of FIGS. 1A-1B, 2A-2B, and 3A-3B.

Figure 5:
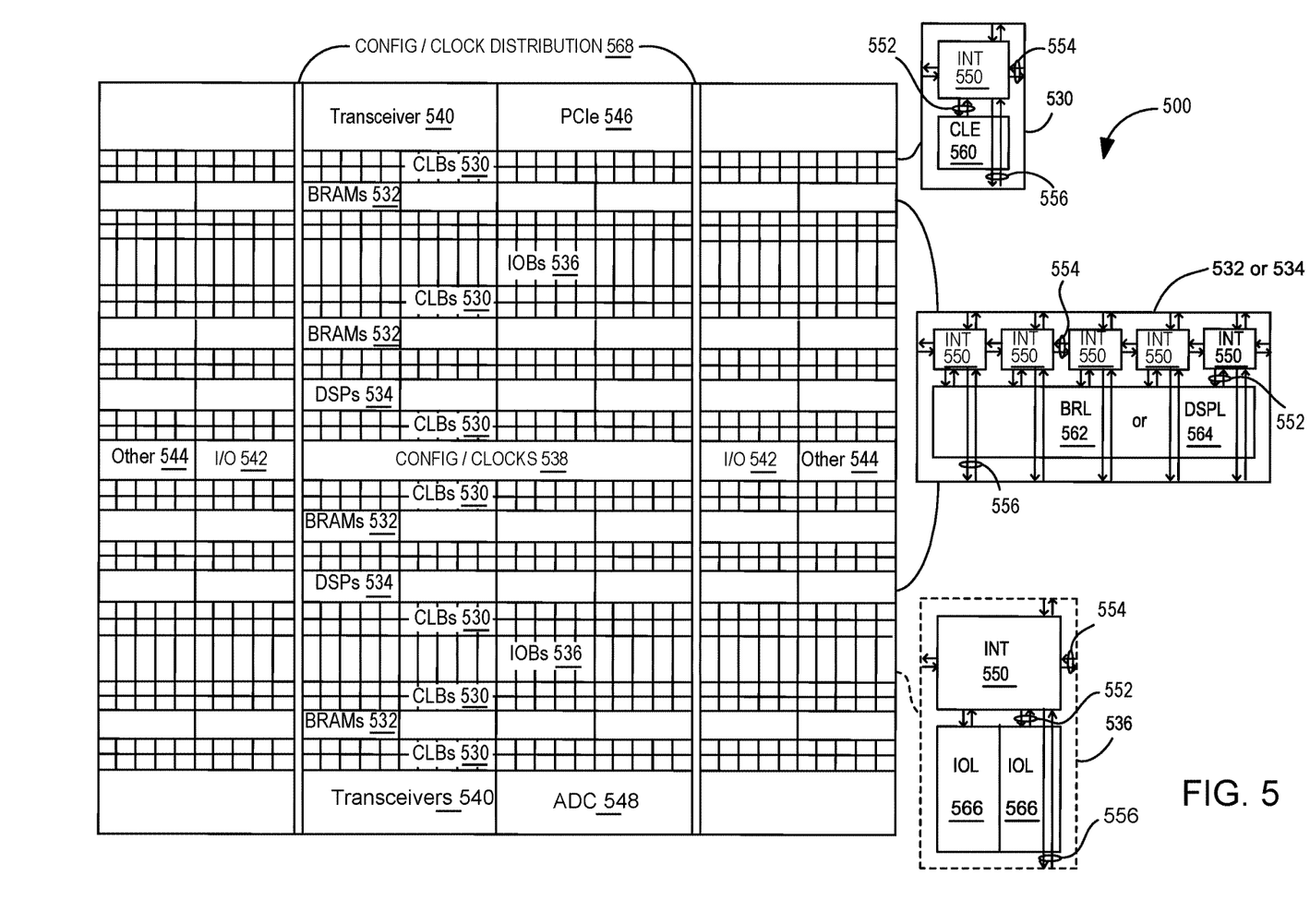
FIG. 5 illustrates a field programmable gate array (FPGA) of a programmable integrated circuit (IC) that may implement SEL mitigation techniques according to some examples.

FIG. 5 illustrates a field programmable gate array (FPGA) of a programmable integrated circuit (IC) 500 that may implement SEL mitigation techniques, such as described above, according to some examples. The programmable IC 500 is implemented on a semiconductor substrate, such as typically included in a die or chip. The various circuits formed in the programmable IC 500 can be formed of nFETs and pFETs in the semiconductor substrate in a repeating cell layout and/or stochastic layout.

The programmable IC 500 includes a large number of different programmable tiles including configurable logic blocks ("CLBs") 530, random access memory blocks ("BRAMs") 532, signal processing blocks ("DSPs") 534, input/output blocks ("IOBs") 536, configuration and clocking logic ("CONFIG/CLOCKS") 538, digital transceivers 540, specialized input/output blocks ("I/O") 542 (e.g., configuration ports and clock ports), and other programmable logic 544 such as digital clock managers, system monitoring logic, and so forth. The FPGA can also include PCIe interfaces 546, analog-to-digital converters (ADC) 548, and the like.

In some FPGAs, each programmable tile can include at least one programmable interconnect element ("INT") 550 having connections to input and output terminals 552 of a programmable logic element within the same tile, as shown by examples included in FIG. 5. Each programmable interconnect element 550 can also include connections to interconnect segments 554 of adjacent programmable interconnect element(s) in the same tile or other tile(s). Each programmable interconnect element 550 can also include connections to interconnect segments 556 of general routing resources between logic blocks (not shown). The general routing resources can include routing channels between logic blocks (not shown) comprising tracks of interconnect segments (e.g., interconnect segments 556) and switch blocks (not shown) for connecting interconnect segments. The interconnect segments of the general routing resources (e.g., interconnect segments 556) can span one or more logic blocks. The programmable interconnect elements 550 taken together with the general routing resources implement a programmable interconnect structure ("programmable interconnect") for the illustrated FPGA.

In an example implementation, a CLB 530 can include a configurable logic element ("CLE") 560 that can be programmed to implement user logic plus a single programmable interconnect element ("INT") 550. A BRAM 532 can include a BRAM logic element ("BRL") 562 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 534 can include a DSP logic element ("DSPL") 564 in addition to an appropriate number of programmable interconnect elements. An IOB 536 can include, for example, two instances of an input/output logic element ("IOL") 566 in addition to one instance of the programmable interconnect element 550. As will be clear to those of skill in the art, the actual I/O pads connected, for example, to the input/output logic element 566 typically are not confined to the area of the input/output logic element 566.

In the pictured example, a horizontal area near the center of the die is used for configuration, clock, and other control logic. Vertical columns 568 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The SEL mitigation techniques can be implemented in any block of the programmable IC 500. As an example, the example of FIGS. 1A and 1B can be implemented in the IOBs 536, BRAM 532, and/or other blocks. Further, the example of FIGS. 2A and 2B can be implemented in the CLBs 530 and/or other blocks. Any combination of examples may be included in a single IC, such as the programmable IC 500 of FIG. 5.

While the foregoing is directed to specific examples, other and further examples may be devised without departing from the basic scope thereof, and the scope thereof is determined by the claims that follow.

What is claimed is:

1. A semiconductor structure comprising:
a semiconductor substrate;
a first p-type transistor having first p+ source/drain regions disposed in a first n-doped region in the semiconductor substrate;
an n-type transistor having n+ source/drain regions disposed in a p-doped region in the semiconductor substrate;
a first n+ guard ring disposed in the first n-doped region and laterally surrounding the first p+ source/drain regions of the first p-type transistor; and
a p+ guard ring disposed laterally surrounding the first n-doped region, the p+ guard ring being disposed between the first p-type transistor and the n-type transistor.

2. The semiconductor structure of claim 1, wherein the first p-type transistor and the n-type transistor are at least part of one of multiple cells on the semiconductor substrate, the multiple cells having a same layout.

3. The semiconductor structure of claim 1, wherein the first p-type transistor and the n-type transistor are in a stochastic layout.

4. The semiconductor structure of claim 1 further comprising:
an n-well ring disposed in the semiconductor substrate and laterally surrounding and separate from the first n-doped region, the p+ guard ring being disposed laterally surrounding the n-well ring; and
a second n+ guard ring disposed in the n-well ring.

5. The semiconductor structure of claim 1 further comprising:
a second p-type transistor having second p+ source/drain regions disposed in a second n-doped region in the semiconductor substrate, the second n-doped region being separate from the first n-doped region; and
a second n+ guard ring disposed in the second n-doped region and laterally surrounding the second p+ source/drain regions of the second p-type transistor, the p+ guard ring further being disposed laterally surrounding the second n-doped region.

6. The semiconductor structure of claim 5 further comprising:
an n-well ring disposed in the semiconductor substrate and laterally surrounding and separate from the first n-doped region and the second n-doped region, the p+ guard ring being disposed laterally surrounding the n-well ring; and
a third n+ guard ring disposed in the n-well ring.

7. The semiconductor structure of claim 1, wherein:
the semiconductor substrate is a p-doped semiconductor substrate, the p-doped region being a portion of the p-doped semiconductor substrate; and
the first n-doped region is an n-well in the semiconductor substrate.

8. A semiconductor structure comprising:
a semiconductor substrate;
a first transistor having a first source/drain region doped with a dopant of a first conductivity type in the semiconductor substrate;
a second transistor having a second source/drain region doped with a dopant of a second conductivity type in the semiconductor substrate;
a first guard ring doped with a dopant of the second conductivity type in the semiconductor substrate, the first guard ring being disposed laterally surrounding the first source/drain region and between the first source/drain region and the second source/drain region; and
a second guard ring doped with a dopant of the first conductivity type in the semiconductor substrate, the second guard ring being disposed laterally surrounding the first source/drain region and between the first source/drain region and the second source/drain region.

9. The semiconductor structure of claim 8, wherein:
the first conductivity type is p-type;
the second conductivity type is n-type; and
the second guard ring is disposed laterally surrounding the first guard ring.

10. The semiconductor structure of claim 8, wherein:
the first source/drain region is disposed in a first doped region with a dopant of the second conductivity type;
the first guard ring is disposed in the first doped region; and
the second guard ring is disposed outside of the first doped region and laterally surrounding the first doped region.

11. The semiconductor structure of claim 8 further comprising a third guard ring doped with a dopant of the second conductivity type in the semiconductor substrate, the third guard ring being disposed laterally surrounding and separate from the first guard ring, the second guard ring being disposed laterally surrounding and separate from the third guard ring.

12. The semiconductor structure of claim 8 further comprising:
a third transistor having a third source/drain region doped with a dopant of the first conductivity type in the semiconductor substrate; and
a third guard ring doped with a dopant of the second conductivity type in the semiconductor substrate, the third guard ring being disposed laterally surrounding the third source/drain region and between the third source/drain region and the second source/drain region, each of the first guard ring and the third guard ring being disposed between the first source/drain region and the third source/drain region, the second guard ring being disposed laterally surrounding the first guard ring and the third guard ring.

13. The semiconductor structure of claim 12 further comprising a fourth guard ring doped with a dopant of the second conductivity type in the semiconductor substrate, the fourth guard ring being disposed laterally surrounding the first guard ring and the third guard ring, the second guard ring being disposed laterally surrounding the fourth guard ring.

14. The semiconductor structure of claim 8, wherein the first transistor and the second transistor form at least a part of a cell having a layout that is repeated on the semiconductor substrate.

15. The semiconductor structure of claim 8, wherein the first transistor and the second transistor are in a stochastic layout.

16. A semiconductor structure comprising:
a p-doped substrate;
a first n-well disposed in the p-doped substrate;
a first p+ source/drain region of a first p-type transistor disposed in the first n-well;
a first n+ guard ring disposed in the first n-well and laterally surrounding the first p+ source/drain region;
a p+ guard ring disposed in the p-doped substrate and laterally surrounding the first n-well; and
an n+ source/drain region of an n-type transistor disposed in the p-doped substrate.

17. The semiconductor structure of claim 16 further comprising:
an n-well ring disposed in the p-doped substrate and laterally surrounding the first n-well, the p+ guard ring being disposed laterally surrounding the n-well ring; and
a second n+ guard ring disposed in the n-well ring.

18. The semiconductor structure of claim 16 further comprising:
a second n-well disposed in the p-doped substrate and separate from the first n-well;
a second p+ source/drain region of a second p-type transistor disposed in the second n-well; and
a second n+ guard ring disposed in the second n-well and laterally surrounding the second p+ source/drain region, the p+ guard ring being laterally surrounding the second n-well.

19. The semiconductor structure of claim 18 further comprising:

an n-well ring disposed in the p-doped substrate and laterally surrounding the first n-well and the second n-well, the p+ guard ring being disposed laterally surrounding the n-well ring; and a third n+ guard ring disposed in the n-well ring.

20. The semiconductor structure of claim 18, wherein no p+ guard ring is laterally surrounding the n+ source/drain region that is not also laterally surrounding the first p+ source/drain region.

* * * * *